United States Patent
Jo et al.

(10) Patent No.: US 8,884,261 B2
(45) Date of Patent: *Nov. 11, 2014

(54) DEVICE SWITCHING USING LAYERED DEVICE STRUCTURE

(75) Inventors: Sung Hyun Jo, Sunnyvale, CA (US); Wei Lu, Ann Arbor, MI (US)

(73) Assignee: Crossbar, Inc., Santa Clara, CA (US)

( * ) Notice: Subject to any disclaimer, the term of this patent is extended or adjusted under 35 U.S.C. 154(b) by 754 days.

This patent is subject to a terminal disclaimer.

(21) Appl. No.: 12/861,432

(22) Filed: Aug. 23, 2010

(65) Prior Publication Data

US 2012/0043519 A1    Feb. 23, 2012

(51) Int. Cl.
*H01L 45/00* (2006.01)
*G11C 13/00* (2006.01)

(52) U.S. Cl.
CPC ............ *H01L 45/085* (2013.01); *H01L 45/148* (2013.01); *G11C 13/0009* (2013.01); *G11C 2213/15* (2013.01); *G11C 2213/51* (2013.01); *G11C 2213/33* (2013.01)
USPC ...................................... 257/4; 257/E45.002

(58) Field of Classification Search
CPC ..................................................... H01L 45/00
USPC ............................................... 257/4, E45.002
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Marc Armand
(74) *Attorney, Agent, or Firm* — Ogawa P.C.

(57) ABSTRACT

A resistive switching device. The device includes a first electrode comprising a first metal material overlying the first dielectric material and a switching material comprising an amorphous silicon material. The device includes a second electrode comprising at least a second metal material. In a specific embodiment, the device includes a buffer material disposed between the first electrode and the switching material. The buffer material provides a blocking region between the switching material and the first electrode so that the blocking region is substantially free from metal particles from the second metal material when a first voltage is applied to the second electrode.

22 Claims, 6 Drawing Sheets

(56) References Cited

U.S. PATENT DOCUMENTS

| | | |
|---|---|---|
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,394,670 B2 | 3/2013 | Herner |
| 8,441,835 B2 | 5/2013 | Jo et al. |
| 8,587,989 B2 | 11/2013 | Manning et al. |
| 8,658,476 B1 | 2/2014 | Sun et al. |
| 8,659,003 B2 | 2/2014 | Herner et al. |
| 2003/0141565 A1 | 7/2003 | Hirose et al. |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0062045 A1 | 3/2005 | Bhattacharyya |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0290186 A1 | 12/2007 | Bourim et al. |
| 2007/0291527 A1 | 12/2007 | Tsushima et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0206931 A1 | 8/2008 | Breuil et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0014707 A1* | 1/2009 | Lu et al. .................. 257/4 |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |

(56) References Cited

U.S. PATENT DOCUMENTS

| | | |
|---|---|---|
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043654 A1 | 2/2012 | Lu et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0235112 A1 | 9/2012 | Huo et al. |
| 2012/0236625 A1 | 9/2012 | Ohba et al. |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| KR | 1020110014248 A | 2/2011 |
| WO | WO 03/034498 A1 | 4/2003 |
| WO | WO 2009/005699 A1 | 1/2009 |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.

(56) References Cited

OTHER PUBLICATIONS

Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 12/861,650 dated Oct. 16, 2012.

(56) References Cited

OTHER PUBLICATIONS

Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Office Action for U.S. Appl. No. 13/417,135 dated Oct. 9, 2012.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
Office Action for U.S. Appl. No. 14/072,657, dated Jun. 17, 2014.

* cited by examiner

DEVICE SWITCHING USING LAYERED DEVICE STRUCTURE

CROSS REFERENCE TO RELATED APPLICATIONS

N/A

BACKGROUND

The present invention is related to switching devices. More particularly, the present invention provides a structure for a resistive switching memory device. The resistive switching memory device has a reduced on state current to provide improved switching and endurance properties, among others.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and also increases power dissipation. It is generally believed that transistor based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses Joules heating, which inherently has high power consumption. Organic RAM or ORAM is incompatible with large volume silicon based fabrication and device reliability is usually poor.

From the above, an improved semiconductor memory device and techniques are therefore desirable.

BRIEF SUMMARY OF THE PRESENT INVENTION

The present invention is related to switching devices. More particularly, the present invention provides a structure for a resistive switching memory device. The resistive switching memory device has a reduced on state current for improved switching and endurance properties, among others.

In a specific embodiment, a switching device structure is provided. The switching device includes a substrate having a surface region and a first dielectric material overlying the surface region. A first electrode overlies the first dielectric material. In a specific embodiment, the first electrode includes at least a metal material. The switching device includes a switching element and a buffer material disposed between the first electrode and the switching element. In a specific embodiment, the buffer material provides a blocking region between the switching material and the first electrode. The switching device includes a second electrode overlying the switching material. The second electrode includes at least a second metal material in a specific embodiment. In a specific embodiment, the blocking region is substantially free of metal particles formed from the second metal material when a first voltage (for example, a write voltage) is applied to the second electrode. In a specific embodiment, the buffer material prevents a high defect region to form between the switching material and the first electrode.

Many benefits are achieved by ways of present invention over conventional techniques. For example, the present resistive switching device can be fabricated using conventional equipment and processes. In addition, the present device uses a layer structure to reduce an on state current as well as power consumption. The layer structure further prevents an electrical connection between the electrodes and improves device endurance and reliability. Depending on the embodiment, one or more of these benefits may be realized. One skilled in the art would recognize other variations, modifications and alternatives.

DETAILED DESCRIPTION OF THE PRESENT INVENTION

The present invention is related to switching devices. More particularly, the present invention provides a structure for a resistive switching memory device. The resistive switching memory device is characterized by a reduced on state current for improved switching and endurance properties, among others.

Resistive switching memory device using a non-crystalline silicon such as amorphous silicon, amorphous-polysilicon and microcrystalline silicon as a switching material and metal electrodes has shown promises in a new class of high density memory devices for fast switching. As merely for illustration, amorphous silicon is used to describe non-crystalline silicon. The on/off behavior of the device depends on metal particles formed in defect sites within the amorphous silicon material. Due to mismatch of materials, defect level in an interface region formed from the amorphous silicon material and a metal electrode is high. As metal particles are formed in the defect sites of amorphous silicon material, these devices usually have a high on state current. Upon repeated cycling, the high on state current leads to shorting of the electrodes and device reliability and endurance are compromised, usually less than a few thousand on/off cycles. Embodiments according to the present invention provide a method and a structure to optimize on state current and improve endurance to more than $10^6$ on/off cycles, well suitable to be used in current and next generation memory devices.

Figure 1:
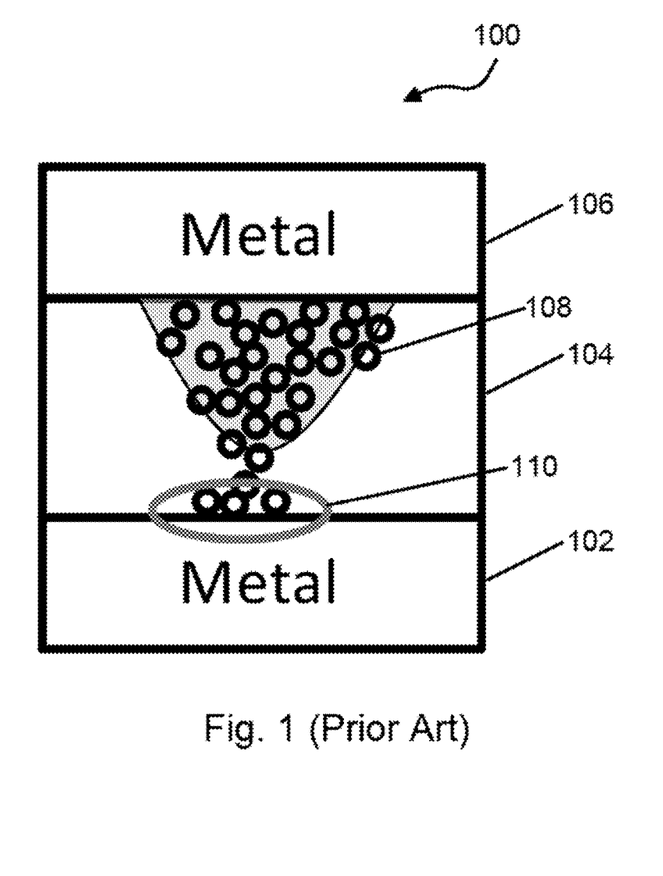
FIG. 1 is a simplified diagram illustrating a conventional resistive switching device

FIG. 1 is a simplified diagram illustrating a conventional resistive switching device 100. As shown, the conventional resistive switching device includes a first metal electrode 102, a second metal electrode 106, and a switching material 104 sandwiched between the first metal electrode and the second metal electrode. For example, the second metal electrode can include at least a noble metal such as silver, gold, palladium, platinum or other suitable metals depending on the application. The first metal material can include common metals used in semiconductor processing such as tungsten, copper, or aluminum. The switching material used is usually a non-conductive material having defect sites or grain boundaries or non-stoichiometric sites allowing a plurality of metal particles from the second metal electrode to form a metal region 108 when a voltage is applied to the second electrode or the first electrode. The metal region further includes a metal filament structure extending towards the first electrode and preferably not in contact with the first electrode. The metal filament extends in a write or read cycle and retracts during an erase cycle. As shown in FIG. 1, as the number of defect sites is high in an interface region 110 formed from the first metal electrode and the switching material, a high concentration of metal particles has the propensity to form in the interface region. This leads to a large on state current and a low on-state resistance. As the device is cycled through a number of on/off cycles, the metal regions initially formed in a portion of the amorphous silicon material may expand too close to the first metal electrode. The metal filament near the first metal electrode may not retract during erase cycles. The metal particles may even coalesce if the defect density is too high and the electrodes are shorted; resulting in a failed device.

Figure 2:
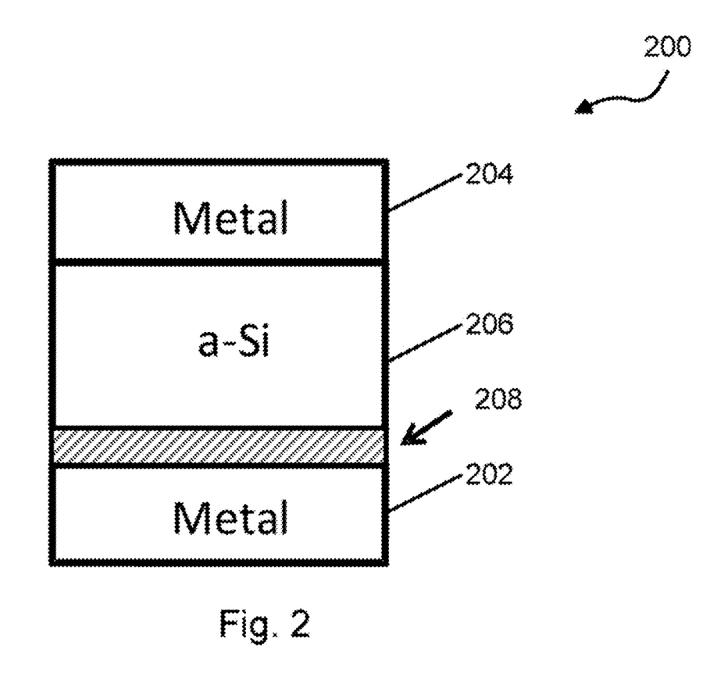
FIG. 2 is a simplified diagram illustrating a resistive switching device according to an embodiment of the present invention.

The terms "second" or "first" throughout the present application are for description and illustration only and should not be construed as the physical arrangement of the electrodes. FIG. 2 is a simplified diagram of a resistive switching device 200 according to an embodiment of the present invention. The resistance switching device is formed overlying a substrate in a specific embodiment. The substrate can be a semiconductor substrate having one or more CMOS devices formed thereon. The one or more CMOS devices are operably coupled to the resistive switching device providing controlling circuitry for the memory device in a specific embodiment. As shown, the resistive switching device includes a first metal electrode 202, a second metal electrode 204, a switching layer 206, and a buffer layer 208. As shown, the buffer layer is disposed between the switching layer and the first electrode in a specific embodiment.

In a specific embodiment, the first metal electrode can be formed from metal material such as copper, aluminum, or tungsten depending on the application. In a specific embodiment, the first metal electrode can further include one or more adhesion layer or barrier layer to prevent metal from the first electrode to diffusion into other parts of the device or an adhesion layer to prevent the metal material to delaminate from, for example, the dielectric layer, depending on the embodiment.

Referring to FIG. 2, the resistive switching device includes switching layer 206. In a specific embodiment, the switching layer comprises an amorphous silicon material. The amorphous silicon material is undoped or having a semiconductor characteristic in a specific embodiment. In a specific embodiment, the amorphous silicon material includes a plurality of defect sites. The plurality of defect sites can arise from silicon dangling bonds, or atomic dislocations, or crystal plane dislocation, or molecular dislocation, or grain boundaries between silicon crystals depending on the process condition.

Resistive switching device 200 includes second metal electrode 204 overlying the switching layer. The second metal electrode includes a metal material, which has a high diffusivity in the switching material in a specific embodiment. The metal material can be silver, copper, aluminum, or other suitable metal materials, including alloy or a combination. In a specific embodiment, the metal material can be silver for an amorphous silicon material as the switching layer. As silver is not commonly used in silicon processing, the silver material forms just a portion of a wiring structure for the switching device, while other portions of the wiring structure comprises convention conducting material such as tungsten, copper or aluminum in a specific embodiment. In a specific embodiment, the silver material is in contact with the amorphous silicon material.

As described, due to material mismatch between the amorphous silicon material and the first electrode, the defect density at the interface region formed from the first metal electrode and the amorphous silicon material in a conventional structure is high. The silver particles in the filament structure are close to each other resulting in a high on state current. After certain number of on/off cycles, the silver particles may coalesce and the silver particles may not be able to retract in an off cycle forming a short between the second electrode and the first electrode, and the device becomes defective. In a specific embodiment, buffer layer 208 is disposed between the first metal electrode and the switching layer. The buffer layer is provided to prevent an interface region to form from the amorphous silicon material and the first electrode and to control defect density of amorphous silicon and metal particles near the first electrode. The buffer layer is selected to have a good and reliable adhesion with the first electrode as well as the amorphous silicon layer. Additionally, an interface region formed from the amorphous silicon material and the buffer layer should have a small defect density for reliable switching and good endurance. The buffer layer is engineered, for example, by adjusting buffer layer resistance, to provide a suitable on state resistance and power consumption during programming.

Figure 3:
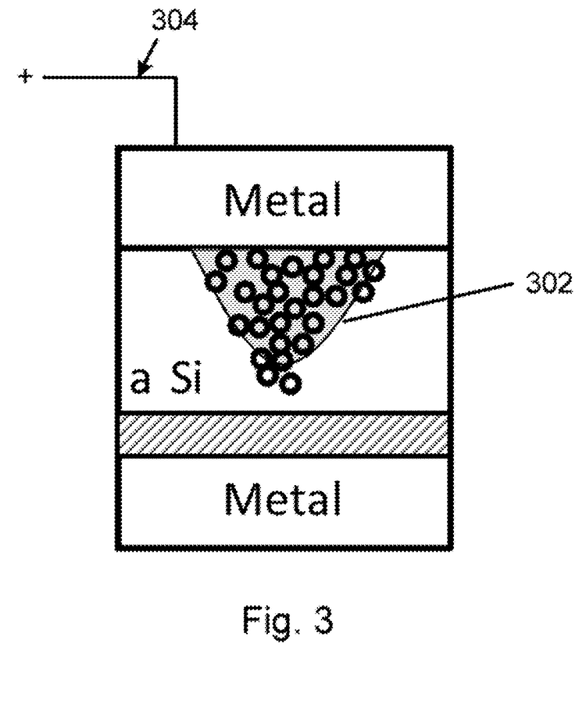
FIG. 3 is a simplified diagram illustrating an off state of the resistive switching device according to an embodiment of the present invention.

Referring to FIG. 3, when a first positive voltage 304 is applied to the second electrode of an as fabricated device, a local electric field is generated and silver particles in various forms, including atoms, ions, or clusters are formed in the amorphous silicon material in a specific embodiment. More specifically, silver particles are formed and trapped in defect sites of the amorphous silicon material. The local electric field enhances silver diffusion in the amorphous silicon material and forms a metal region 302 comprises of the silver particles in a specific embodiment. This first positive voltage can be in the range of 4 volts to about 6 volts depending on the process condition of the amorphous silicon material. As shown the metal region is formed in vicinity of the second electrode surface region, and not in contact with the first electrode. In a specific embodiment, the first positive voltage is a forming voltage or electroforming voltage for the switching device. The switching device is in now in an off state.

Figure 4:
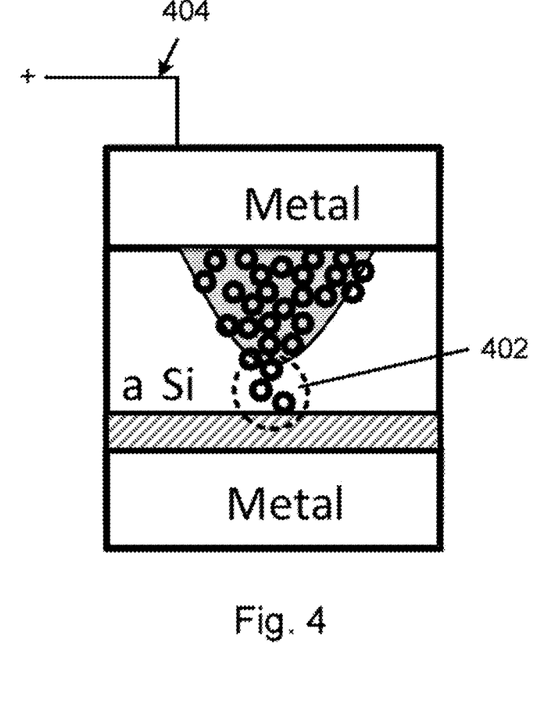
FIG. 4 is a simplified diagram illustrating an on state of the resistive switching device according to an embodiment of the present invention.

Referring to FIG. 4, when a second voltage 404 is applied to the second electrode, a filament structure 402 extending from the metal region is formed. As shown, the buffer layer functions as a blocking layer such that the filament structure would not extend to be in contact with the first electrode in a specific embodiment. The second voltage can be, for example, a write voltage for the switching device in a specific embodiment. The switching device is in an on state and an on state current flow s between the second electrode and the first electrode. The on state current is controlled by the length of the filament structure in a specific embodiment. In a specific embodiment, the on state current can range from a few nano amperes to micro amperes, much less than that of a conventional switching device absent of the buffer layer.

Figure 5A:
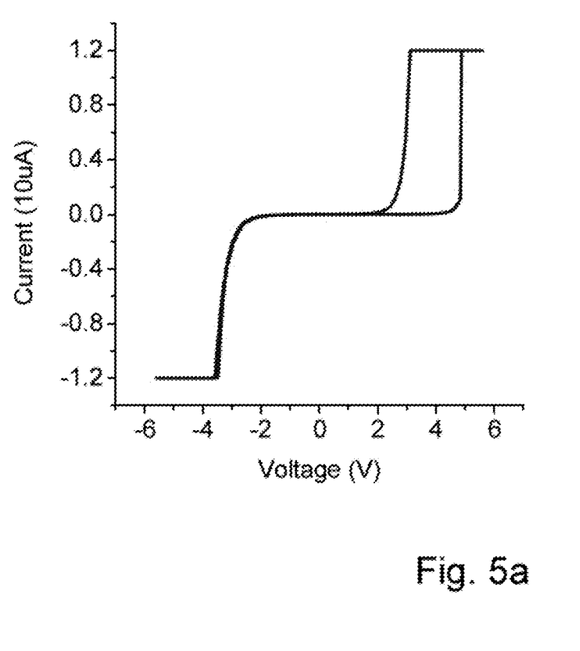
FIGS. 5a and 5b are simplified current versus voltage (I-V) plots of resistance device according to embodiments of the present invention.
Figure 5B:
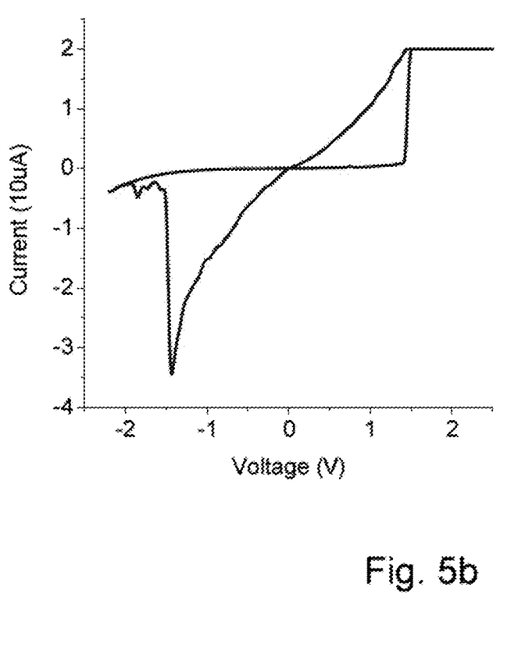

In a specific embodiment, for a proper function of a resistive switching device, the buffer layer should have good contact with the first electrode to allow a low contact resistance (or forming an ohmic contact) in a contact region formed from the buffer layer and the first electrode. The low contact resistance avoids excess voltage drop across the contact region in a specific embodiment. FIG. 5(a) illustrates a switching characteristic of a first switching device having a non-ohmic contact (that is, high contact resistance) between the buffer layer and the first electrode. The high contact resistance between the buffer layer and the first electrode suppresses current flow at small bias and certain read operation at low voltage cannot be performed properly. The first switching device is further characterized by a high programming voltage (>5 volts) and may cause an early device failure and high leakage current, among others. FIG. 5(b) illustrates a switching characteristic of a second switching device having a good ohmic contact between the buffer layer and the first electrode or the contact resistance is low. The second switching device exhibits desirable switching characteristic, for example, low programming voltage, between 1-2 volts.

In certain embodiments, the buffer layer can include an insulating layer. The insulating layer should be thin, for example less than about 2 nm, so that electrons can tunnel across the thin insulating buffer layer from a conducting metal region, for example, silver particles in the switching layer and the first electrode. Electron tunneling allows for the device to be in an on state when a suitable voltage is applied to the electrodes. Electron tunneling also allows for proper read operation of the device when a small bias voltage is applied. The contact resistance between such buffer layer and the first electrode may not be as critical in a specific embodiment.

In a specific embodiment, the buffer layer can include a material having a higher density than the amorphous silicon material to prevent silver particles from being injected into the buffer layer and forming conducting filament in the buffer layer. In an alternative embodiment, the buffer layer can be conductive having a large thickness (for example, about 20 nm or greater). Of course one skilled in the art would recognize other variations, modifications, and alternatives.

It has been observed that resistive switching devices using amorphous silicon as the switching material and silver as the second electrode can have vastly different switching characteristics depending on the deposition process of amorphous silicon material. When the amorphous silicon material is formed using a sputtering process, a high voltage, greater than about 8 volts is required to read, to write or to erase. This suggests that silver particles do not form easily in the sputtered amorphous silicon at normal device operation voltage. Sputtered amorphous silicon contains an insignificant amount of hydrogen and tends to have a high density. Hence a thin (preferably less than 5 nm) sputtered amorphous silicon can be used as the buffer layer in a specific embodiment.

For amorphous silicon formed using a plasma enhanced chemical vapor deposition (PECVD) or a low pressure chemical vapor deposition (LPCVD) process and silane as a silicon source, switching voltages are usually lower, ranging from one to four volts, depending on the process conditions. Amorphous silicon material formed by a CVD process using silane contains hydrogen, which can diffuse or migrate in and out of the silicon matrix, leaving void sites in the material. Silver particles can occupy these void sites or defect sites and allow to migrate upon application of a voltage. It has also been observed that devices merely uses a metal/amorphous silicon/metal configuration have a low on/off endurance, that is such device fails after at most a few thousand on/off cycles.

Figure 6:
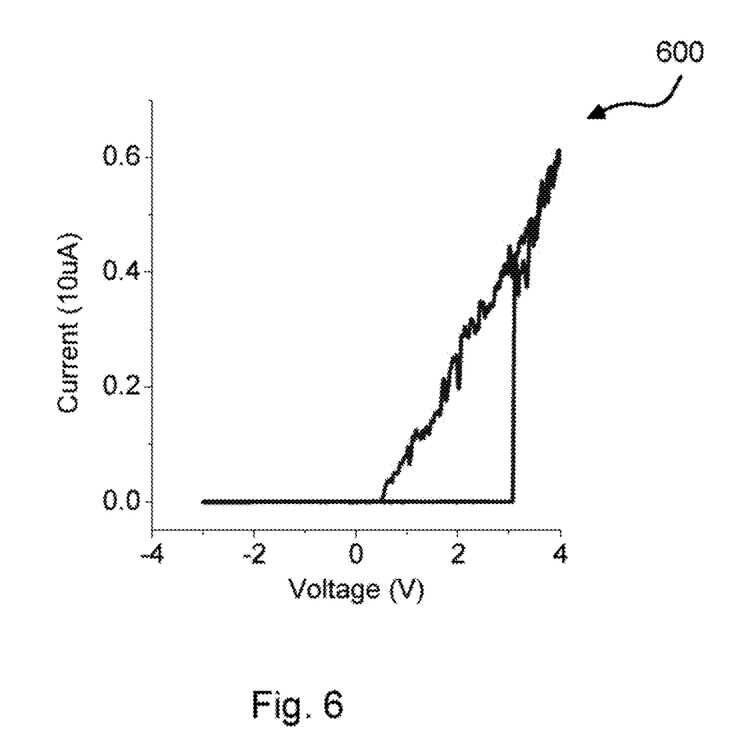
FIG. 6 is a simplified I-V plot of a switching device according to an embodiment of the present invention.

As merely an example, the buffer layer can include a polysilicon material. The polysilicon material is preferably p+ doped and having an impurity concentration ranging from about $10^{18}$ to about $10^{22}$ atoms per $cm^3$. As shown in FIG. 6, a current versus voltage (I-V) plot 600 of a third switching device is provided. The third switching device has a silver/amorphous silicon/p+ polysilicon device structure. The amorphous silicon material in the third switching device is deposited using a low pressure chemical vapor deposition process at a deposition temperature of about 510 Degree Celsius using silane as a silicon source.

Figure 7:
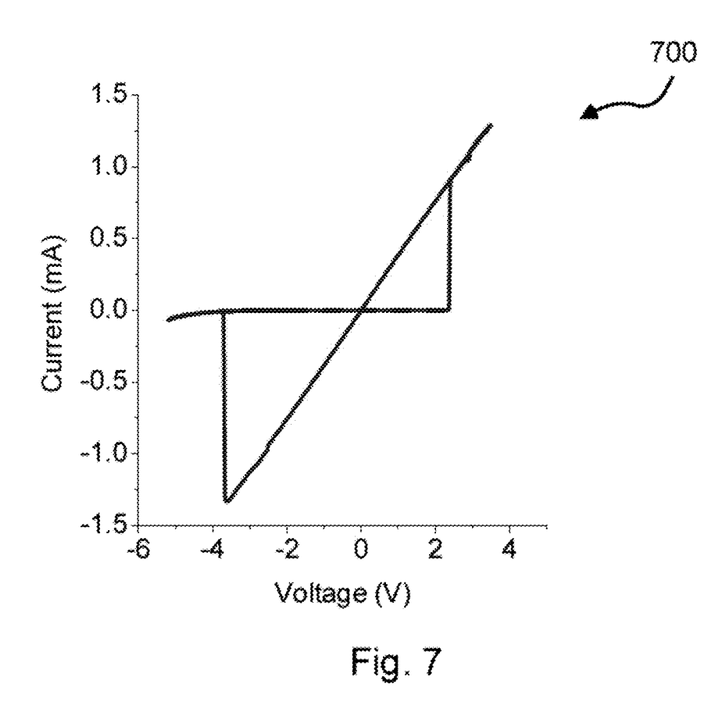
FIG. 7 is a simplified I-V plot of a conventional switching device.

FIG. 7 illustrates an I-V plot 700 measured from a fourth switching device having a conventional silver/amorphous silicon/nickel device structure. The amorphous silicon in the second switching device is deposited using a plasma enhanced chemical vapor deposition process at a deposition temperature of about 370 Degree Celsius. Both the third switching device and the fourth switching device have a cell size of about 60 nm by 60 nm. Typically, amorphous silicon material deposited at 370 Degree Celsius by a CVD method has a much lower defect density than one deposited at 510 Degree Celsius. The fourth device is thus expected to have a lower on state current than that of the third switching device. However, as the defect density is higher at the interface region formed by the amorphous silicon and the first metal material, nickel in this case, the on state current of the fourth device (plot 700) is much higher, in mA range, than that of the third device (plot 600). High current is not desirable as it results in an unreliable device operation. The polysilicon buffer layer in the third switching device prevents excess defect density near the first electrode, and the programming current is much lower, in the uA range, as shown in plot 600. Additionally, the polysilicon buffer layer can be modified easily, by changing its thickness or conductivity to control the programming current and further enhance device performance. One skilled in the art would recognize other variations, modifications, and alternatives.

In a specific embodiment, a method of forming a resistive switching device is provided. The method includes providing a semiconductor substrate having a surface region. The semiconductor substrate can have one or more CMOS devices formed thereon. The semiconductor substrate can be single crystal silicon material, silicon germanium, silicon on insulator, and the likes. A first dielectric material is formed overlying the surface region. The first dielectric material can be silicon oxide, silicon nitride, silicon oxynitride, and others. The first dielectric material can be deposited using techniques such as chemical vapor deposition including plasma enhanced chemical vapor deposition, physical vapor deposition, spin on coating, and any combinations of these, and others.

In a specific embodiment, the method includes forming a first electrode overlying the first dielectric material. The first electrode is formed from a conductor material commonly used in semiconductor processing. The conductor material can include tungsten, copper, or aluminum depending on the application. The first electrode can include one or more adhesion layer or diffusion barrier. The adhesion layer may be titanium, titanium nitride, tantalum nitride, or tungsten nitride to prevent diffusion of the conductor material into the first dielectric material in a specific embodiment. Depending on the application, the conductor material can be deposited using a physical vapor deposition process, a chemical vapor deposition process, electrochemical including electroplating and electroless plating, and combination thereof. The conductor material including the adhesion layer is subjected to a pattern and etch process to form a first electrode. In a specific embodiment, the first structure is configured to extend in a first direction. Of course one skilled in the art would recognize other variations, modifications, and alternatives.

The method includes depositing a buffer layer overlying the first electrode in a specific embodiment. The buffer layer should have properties to allow desirable switching characteristic for the switching device. The buffer layer should also form a reliable interface with selected switching material used in the switching device. A high density material may be used to prevent metal particles to inject into the buffer layer. The buffer layer can be a conductive material or an insulating material depending on the embodiment. A conductive buffer layer can include a p-doped silicon material such as p+ polysilicon material in a specific embodiment. An insulating buffer layer should have a thickness less than about 5 nm so that electrons can tunnel through at operating voltages (between 1-3 volts).

For an amorphous silicon material as switching material, a polysilicon material can be used for the buffer layer. The polysilicon material is preferably having a p+ type impurity characteristic, which may be provided using a boron species in a specific embodiment. The p+ polysilicon material may be deposited using a chemical vapor deposition technique using at least silane, disilane, or a suitable chlorosilane as precursor.

The method forms a switching material overlying the buffer material. As merely an example, the switching material is an amorphous silicon material deposited using techniques such as chemical vapor deposition using silane, disilane, or chlorosilane as silicon source. Deposition temperatures is usually at about 250 Degree Celsius to about 600 Degree Celsius depending on the embodiment. Process parameters and process conditions greatly influence defect density in the amorphous silicon material and switching behavior of the switching device. Therefore, the use of amorphous silicon switching material provides flexibility in device design in a specific embodiment.

In a specific embodiment, the method includes depositing a second electrode material overlying the switching material. The second electrode material has a first portion that includes a metal material in direct contact with the switching material. The metal material is preferably having a suitable diffusion characteristic in the amorphous silicon material in a preferred embodiment. The metal material can be silver in a specific embodiment. Other suitable metal materials may also be used. These other materials can include platinum, palladium, gold, copper, nickel, and others. The second electrode material further includes a second portion for electrical connection with other devices. The second portion can be selected from tungsten, copper, or aluminum, commonly used in semiconductor processing. The method forms a second electrode structure by a suitable pattern and etch process. In a specific embodiment, the second electrode structure is configured to extend in a second direction at an angle to the first direction. In a preferred embodiment the second electrode structure and the first electrode structure are arranged orthogonal to each other having a switching element sandwiched at an intersecting region formed from the second electrode and the first electrode. One skilled in the art would recognized other variations, modifications, and alternatives.

The method then performs other backend processes such as global interconnects and passivation among others to form a resistive switching memory device.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A resistive switching device, comprising:
   a first electrode comprising a first metal material;
   a second electrode comprising at least a second metal material;
   a switching material, the switching material comprising a non-conductive material having non-stoichiometric sites, wherein the non-stoichiometric sites are configured to trap metal particles of the second metal material derived from the second electrode therein;
   and
   a buffer material disposed between the first electrode and the switching material and completely separating the first electrode and the switching material, the buffer material providing a blocking region between the switching material and the first electrode, the blocking region being substantially free from the metal particles from the second metal material when a first voltage is applied to the second electrode.

2. The device of claim 1 wherein the first voltage is a write voltage or a read voltage.

3. The device of claim 1 wherein the second metal material is selected from a group consisting of: Silver, Copper, Aluminum, metal alloy.

4. The device of claim 1 wherein the second metal material is selected from a group consisting of: a silver material, a platinum material, or a palladium material.

5. The device of claim 1 wherein the buffer material has a thickness of less than about 2 nm.

6. The device of claim 1 wherein the first voltage causes a first on state current upon application of the first voltage, the first voltage being a write voltage.

7. The device of claim 1 wherein the buffer material comprises amorphous silicon.

8. The device of claim 1 wherein the buffer material comprises a polycrystalline silicon-containing material having a p+ impurity characteristic.

9. The device of claim 1 wherein the buffer material is characterized by a thickness to allow for tunneling of electrons across the buffer material upon application of the first voltage.

10. The device of claim 1 wherein the buffer material is a conductive material.

11. The device of claim 1 wherein the buffer material is characterized by a density, the density prevents the metal particles to form metal regions or conducting filaments in the buffer material.

12. The device of claim 1 wherein the blocking region prevents the accumulation of metal particles in a vicinity of the first electrode.

13. The device of claim 1 wherein the buffer material comprises a silicon material substantially free from hydrogen species.

14. The device of claim 4 wherein the second metal material forms a metal region comprising the metal particles in a portion of the switching material in a vicinity of the second electrode upon applying a positive voltage larger than a first threshold voltage to the second electrode.

15. The device of claim 4 wherein the buffer material inhibits the metal particles from contacting the first electrode.

16. The device of claim 6 wherein the first on state current is less than a second on state current, the second on state current being caused by a second device absent of the buffer material upon application of the first voltage.

17. The device of claim 8 wherein the p+ impurity characteristic is provided by a boron species at a concentration within a range of about 1E18 atoms per cm$^3$ to about 1 E22 atoms per cm$^3$.

18. The device of claim 9 wherein the first voltage is within a range of about 1 volts to about 3 volts.

19. The device of claim 13 wherein the silicon material substantially free from hydrogen species is formed by sputtering or evaporation of silicon.

20. The device of claim 14 wherein the first threshold voltage ranges from about 1 volts to about 2 volts.

21. The device of claim 14 wherein the metal region further comprises a filament structure characterized by a length, the length being dependent on first applied to the second electrode.

22. The device of claim 21 wherein the length of the filament structure is reduced when a reverse bias voltage having an opposite polarity to the first voltage is applied.

* * * * *